United States Patent
Genfan

(10) Patent No.: US 6,337,607 B1
(45) Date of Patent: Jan. 8, 2002

(54) SURFACE MOUNTABLE LOW IMD FERRITE ISOLATOR/CIRCULATOR STRUCTURE

(75) Inventor: German S. Genfan, Newton, MA (US)

(73) Assignee: Renaissance Electronics Corporation, Harvard, MA (US)

( * ) Notice: Subject to any disclaimer, the term of this patent is extended or adjusted under 35 U.S.C. 154(b) by 0 days.

(21) Appl. No.: 09/570,690

(22) Filed: May 12, 2000

(51) Int. Cl.[7] .............................. H01P 1/36; H01P 1/38
(52) U.S. Cl. ................ 333/1.1; 333/24.2; 361/818
(58) Field of Search ............................. 333/1.1, 24.2, 333/12; 361/816, 818

(56) References Cited

U.S. PATENT DOCUMENTS 5,068,629 A * 11/1991 Nishikawa et al. .......... 333/1.1
6,011,449 A * 1/2000 Jussaume et al. ............ 333/1.1

* cited by examiner

Primary Examiner—Justin P. Bettendorf

(57) ABSTRACT

A structure for a high power low IMD passive microwave device, mainly for automated placement. The structure includes substantially flat housing having slots and a cover having notches. Slots and notches form openings to snugly receive printed circuit boards (PCBs) having signal transmission lines on both sides. Also, on both sides of PCBs opposite to the signal lines, the ground planes are located. The passive device is disposed between the housing and the cover, and electrically connected to the signal transmission lines inside the structure that is totally closed and sturdy. Bottom surface of PCBs and that of the housing are coplanar. PCBs are reinforced on both their sides by supports extended from the housing. Such a structure provides homogeneous leads and best conditions for automated placement. Inductance in signal lines is well balanced by capacitance to ground planes that in combination with structurally homogeneous leads provides low IMD. Emittance of RF field from the high power passive device into environment is negligible due to totally closed structure.

10 Claims, 3 Drawing Sheets

SURFACE MOUNTABLE LOW IMD FERRITE ISOLATOR/CIRCULATOR STRUCTURE

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

The increased demand from the communication industry to provide greater channel capacity coupled with the increased power requirements has exposed a condition within RF structures referred to as Intermodulation Distortion (IMD). This condition occurs when non-linearity within the structures, especially in their lead portions, distort the waveform resulting in generation of the other frequencies which can effectively block the channel. In other words, the distorted waveform consists of the desired fundamental plus a decaying series of related harmonics that, in themselves, interact with other carriers present on the transmission line. Intermodulation signals grow rapidly with power, and power tends to increase. In cellular phone communications, for example, maximum emission power can be as high as 30 Watts. In some applications it can be even 50 Watts and over. The reduction of nonlinear intermodulation noises is therefore of crucial importance, not only to improve the quality of signals, but also to allow fewer radio stations to be distributed in the transmission network. The above is the first aspect that should be taken into consideration in isolator/circulator design.

The second aspect is a body mechanical structure, particularly leads for connecting the ferrite isolator/circulator disposed inside the body to signal transmission lines outside the body. With huge applicability of ferrite isolators/circulators in microwave industry, the great importance is ease of installation and subsequent progression into automated placement. For an automated pick and place method to be used in production, the following requirements should be met: (a) robust structure of the body and contacts of the device, and (b) complanarity of the contact leads with the bottom surface of the body.

Structures that were intended to conform to both aspects mentioned above are known. According to Jussaume and Paquette teaching (U.S. Pat. No. 6,011,449), the leads (electrical conductors) for the passive device extend from openings in the body of the structure to substantially rigid supports. The conductors are positioned above said support and are electrically connected to contacts that are secured in apertures formed in the supports. For isolating the contacts from the supports a dielectric material is disposed on perimeter of the contacts. Those contacts go through the supports and exposed at bottom surfaces thereof. Bottom surface of the contacts is substantially coplanar with the bottom surface of the body. The body is metal; a ferrite isolator/circulator is disposed inside the body.

In the known structure, each conductor connecting the device disposed inside the body to a transmission line located outside the body goes via (a) opening in the body, (b) portion of the support, and (c) dielectric inside the aperture in the support. In order to avoid IMD all those three segments of the conductor's path should have the same impedance (usually 50 Ohms) and minimal mechanical imperfections. However, meeting these requirements with the known structure is problematic. The body is formed of two parts: a housing and a cover. In order to keep given impedance in segment (a), location of the conductor relative to the housing and the cover should be precisely defined. Considering a structure comprising a very thin conductor (usually 0.005" thick) in the air within a rectangular opening formed by two sheet metal parts, some non-linearity deem inevitable. In segment (b) the same thin conductor located in the air above sheet metal support. In operation, the conductor and the support produce capacitance that is portion of the impedance. Any variations in distance between the conductor and the support lead to variations in capacitance and, in turn, in impedance. And, at last, a transition from segment (b) to segment (c) and imperfections in the assembled segment (c) can also lead to non-linearity.

There is one more aspect of the structure that should be taken into consideration: electrical arcing. With high power, the probability of arcing between a conductor in the air and metal ground is also high due to relatively low permitivity of the air (versus that of a dielectric material).

Another aspect: the necessity for the known structure to have openings in the housing for conductors in the air to go through. In operation, the RF field produced by the ferrite isolator/circulator disposed inside the structure may freely emit outside through those openings. The emission becomes more important with power. The openings also affect rigidity of the structure.

Accordingly, what is needed is a structure for ferrite isolator/circulator having more homogeneous construction of the leads to transmission lines of an outside system with no or minimum portions of the conductors in the air. Such a structure will enable to minimize IMD and probability of arcing in high power ferrite devices. In combination with the homogeneous structure of the leads, a robust and truly surface mount contact assembly that enables fully automated placement and soldering is also needed. A closed structure that minimizing RF field emission into environment is also needed.

BRIEF SUMMARY OF THE INVENTION

The present invention relates to a structure having substantially homogeneous leads that provide minimum non-linearity connection from a ferrite isolator/circulator disposed inside the structure to a signal transmission line disposed outside the structure. The structure according to the present invention comprises a housing, a cover and plurality of leads. The housing having central substantially flat round portion, peripheral portion, bottom and top surfaces, and slots is a base portion of the structure. The housing further comprises supports extended from the peripheral portion to receive printed circuit boards (PCBs) and tabs to receive the cover. The housing and the cover are metal. The slots are made in the supports and partially extended into the central portion of the housing. The PCBs are snugly inserted in the slots and secured in them by a gluing compound (epoxy, for example). The bottom surface of the housing is coplanar with the bottom surface of the PCBs. The supports are bent a little up and go diagonally on both sides of each PCB from its bottom surface to its top surface, mechanically reinforcing the PCB. The supports and the PCBs together constitute leads. Because of the bent supports the bottom surface of the PCBs has better access for soldering to a signal transmission line. The tabs are extended from the peripheral portion of the housing, and bent up to approximately 90 degrees. Each tab has a dimple protruding outward the housing. The cover comprises a saucer-like portion and a skirt having holes to receive the dimples, and notches to receive the PCBs. The tabs are located inside the cover, the skirt makes edge contact to the peripheral portion of the housing, and the notches in the cover make contact to the PCBs on their top surface and side portion. The dimples protrude into holes in the cover and lock it in place. The ferrite isolator/circulator is disposed on the top surface of the central portion of the housing and is held in place by the saucer-like portion of the cover. This portion provides some spring action causing the ferrite isolator/circulator to be pressed in place between the cover and the housing. The slots in the housing and, accordingly, the PCBs are extended into the central portion up to the ferrite isolator/circulator.

All PCBs in this structure are identical. Each PCB comprises a ground plane and a signal transmission line on both top and bottom surface. Side portions are bare dielectric. On the top surface of the PCB the signal line starts from the ferrite isolator/circulator and stops within the cover near its skirt, where it is connected by a printed through hole (PTH) to the signal line on the bottom surface of the PCB. Opposite to each signal line, on the other surface of the PCB locates the ground plane that, in operation, provides necessary capacitance to the signal line. In operation, inductance of the PTH is offset by capacitance to metal of the housing on the side portions of the PCB. To increase this capacitance the PTH is oval oriented along the PCB. As an option, the oval can be substituted with a plurality of round PTHs. Circuit of the ferrite isolator/circulator is connected to the signal lines of the PCBs inside the cover. The notches in the cover make contact with the ground planes on the top surface of the PCBs. It provides good grounding through metal of the cover and the housing and, at the same time, closes the ferrite isolator/circulator preventing RF field to emit into environment and providing maximum rigidity to the structure.

Thus, the structure according to the present invention has electrically homogeneous, mechanically reinforced and arc protected leads to the outside transmission lines. PCBs in the structure provide leads with the most homogeneous properties. The supports provide adequate reinforcement on both sides of the PCBs. Because of the absence of conductors in the air better immunity to arcing is also provided. Another advantage of the structure its entirely closed construction (no openings in the housing or the cover for signal transmission line conductors). One more advantage can be used in assembly process of the structure: ends of the PCBs within the housing are centering the ferrite isolator/circulator.

It is an object of the present invention to have electrically homogeneous rigid leads for a high power ferrite isolator/circulator which provide low IMD connection to the outside signal transmission lines.

It is a further object of the present invention to have mechanically sound structure of the ferrite isolator/circulator that is readily adaptable to automated placement.

It is a further object of the present invention to have lead conductors on PCB (for connections to outside transmission lines), which are less susceptible to arcing compare with conductors in the air.

It is a feature of the present invention to have a rigid support structure for the conductors connecting the ferrite isolator/circulator to the outside signal transmission lines.

It is a further feature of the present invention to have the lead contacts of the ferrite isolator/circulator coplanar with the bottom of the housing in a substantially fixed manner.

It is an advantage of the present invention to have a structure that is entirely closing the ferrite isolator/circulator disposed inside the structure.

It is a further advantage of the present invention to have a structure that provides centering for the ferrite isolator/circulator during the structure assembly process.

DETAILED DESCRIPTION OF THE INVENTION

Figure 1:
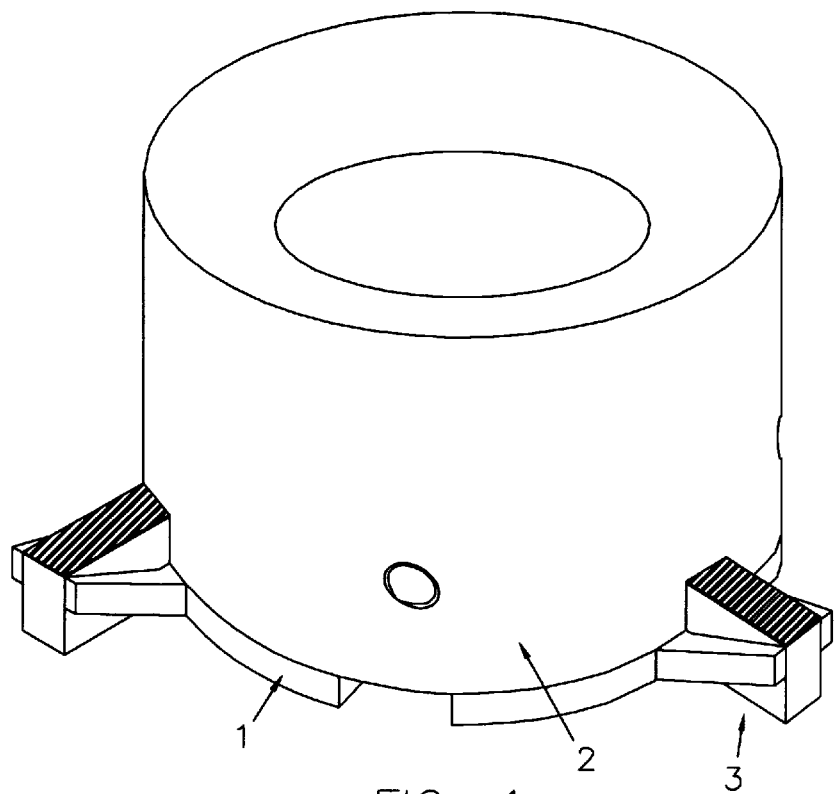
FIG. 1 shows the preferred embodiment of the structure according to the present invention.
Figure 2:
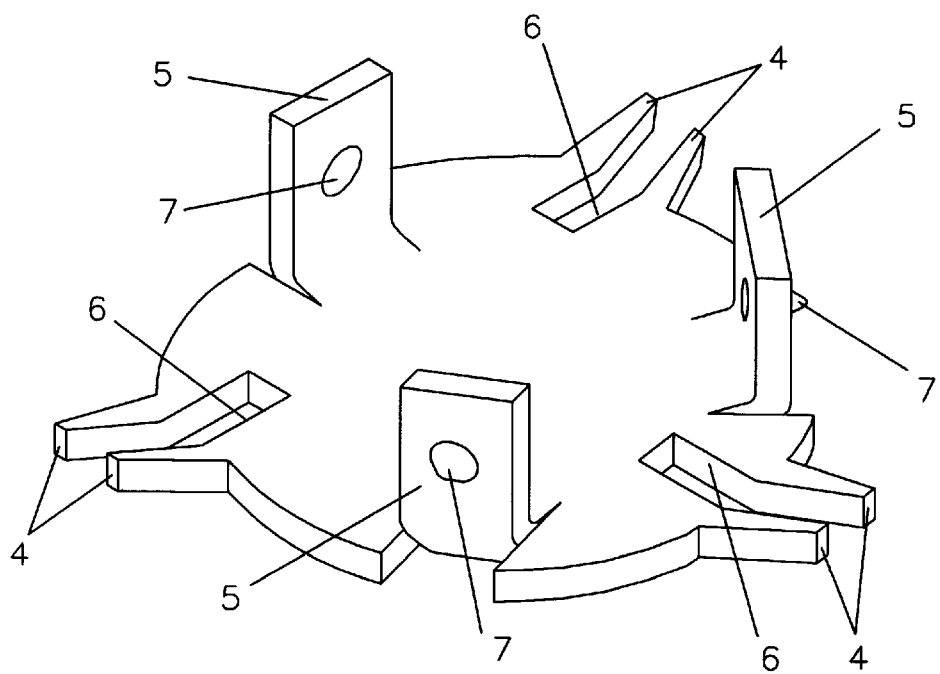
FIG. 2 is a perspective view of the housing.

Referring to FIG. 1 the structure according to the present invention comprises a housing 1, a cover 2 and leads 3. Turning to FIG. 2 the housing 1 comprises substantially round and flat central portion and a peripheral portion with a plurality of supports 4 and tabs extended from it. In the supports 4 slots 6 are disposed and partially extended into the central portion. All supports 4 are slightly bent up, and all tabs 5 are bent up to substantially 90-degree angle relative to the central portion of the housing 1. Each tab 5 has a dimple 7 protruding outward. All tabs 5 are approximately equally spaced along the peripheral portion. Both supports 4 and tabs 5 are formed out of the material of the housing 1, which is metal.

Figure 3:
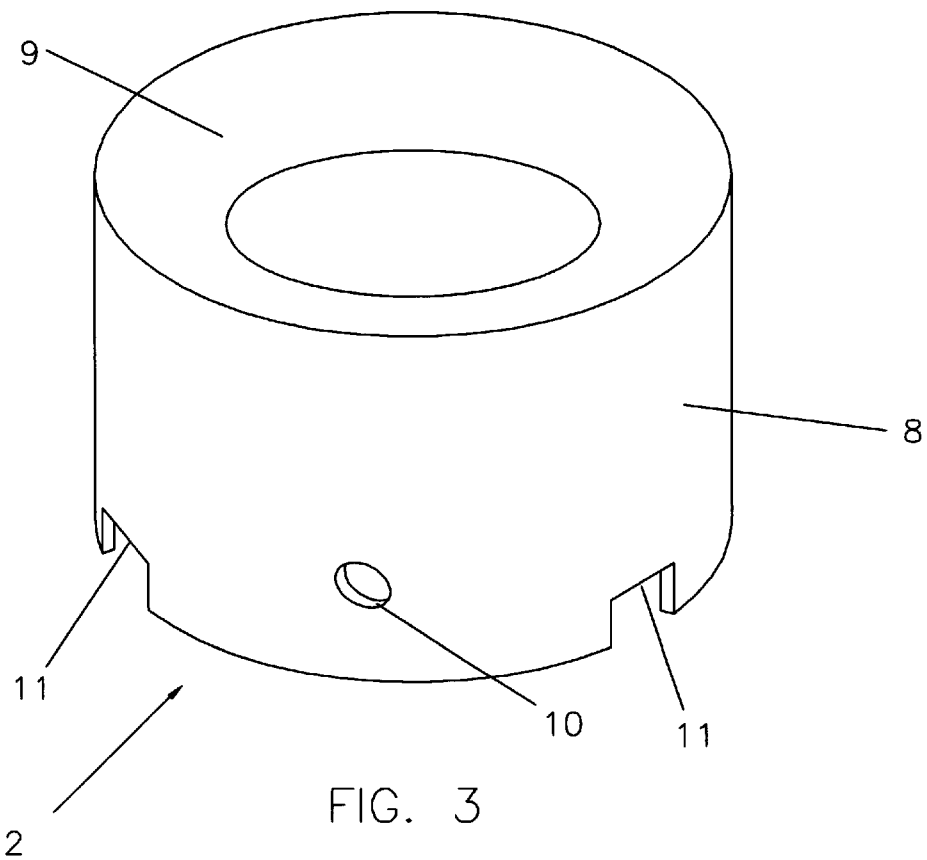
FIG. 3 is a perspective view of the cover.

Referring to FIG. 3 the cover 2 comprises a skirt 8 and a saucer-like portion 9. The skirt 8 further comprises plurality of holes 10 and notches 11. Outside diameter of the skirt 8 is substantially equal to that of the central portion of the housing 1. The dimples 7 protrude into holes 10 and retain the cover 2 in place on the housing 1. The notches 11 in the cover 2 coincide with the slots 6 in the housing 1, and the skirt 8 makes edge contact with the peripheral portion of the housing 1.

Figure 4:
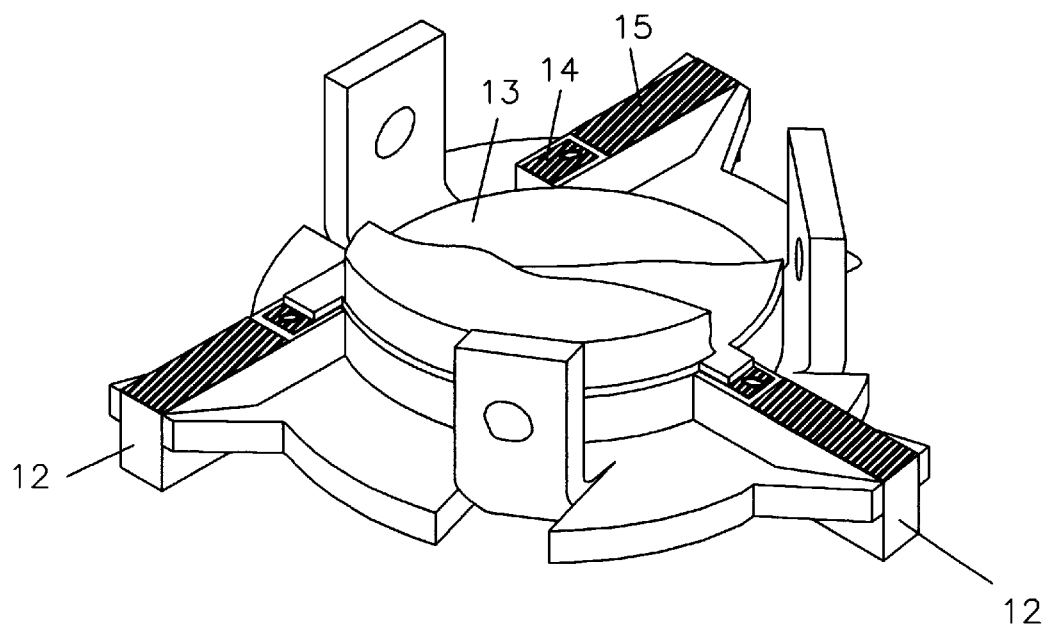
FIG. 4 is a perspective view of the housing assembled with PCBs and partially assembled with a ferrite isolator/circulator (some portions of the last are not shown for clarity).

FIG. 4 shows the housing 1 assembled with PCBs 12 and having a ferrite isolator/circulator 13 (shown partially for clarity) disposed in the housing 1. The structure of the ferrite isolator/circulator 13 might varie, and shown as an example only as having two ferrites, circuit in between and a magnet (shown on FIG. 5) on top. Each PCB 12 is snugly disposed and secured in the slot 6 by a gluing compound (epoxy, for example). Bottom surface of PCBs 12 and that of the housing 1 central portion are coplanar. Supports 4 reinforce the PCB 12, and together they constitute leads 3. Supports 4 locate diagonally on both sides of the PCB 12 extending from the peripheral portion of the housing 1. PCBs' 12 ends that are inside the housing 1 represent a locator for centering a ferrite isolator/circulator 13 in the structure.

Figure 6:
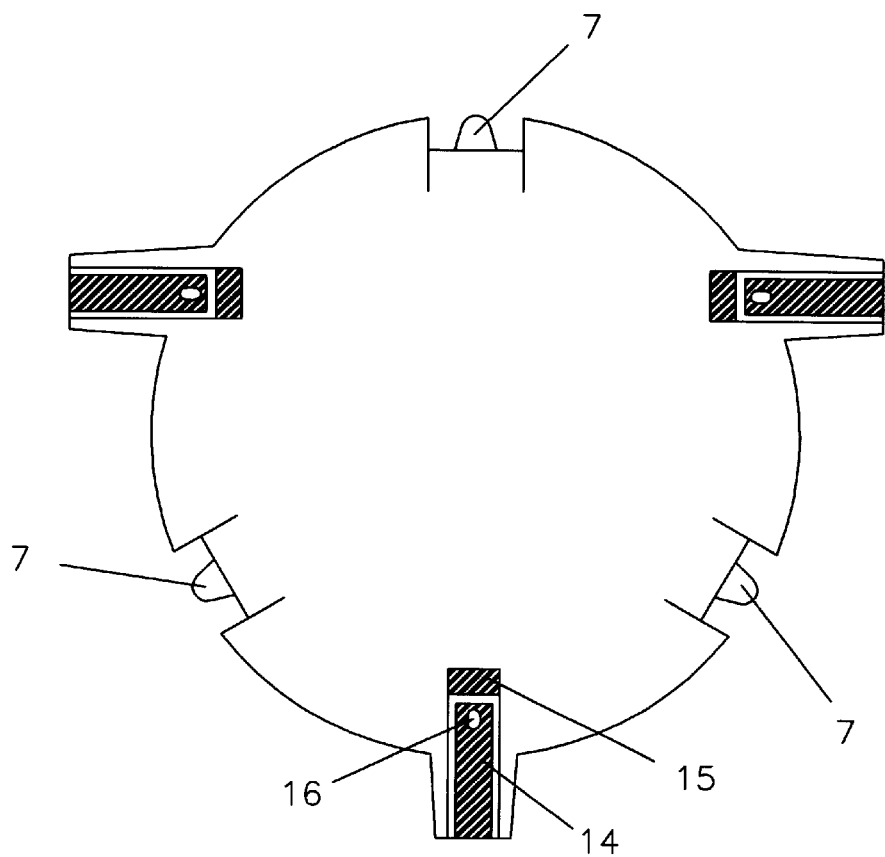
FIG. 6 is a bottom view of the assembly according to FIG. 4.

As shown on FIGS. 4 and 6, all PCBs 12 are structurally identical, each having a signal transmission line 14 and a ground plane 15 on both their top and bottom surfaces. The signal line 14 on top surface of the PCB 12 is connected to that on bottom surface by means of a PTH 16. Any transmission line may be represented by a chain of inductors connected in series with a plurality of capacitors connecting each "link" of the chain to the ground. In the PCB 12 the ground planes 15 provide capacitance for the signal lines 14 situated on opposite surface of the PCB 12. Capacitance for the PTH 16 is provided by side walls of the slots 6 in the housing 1. To increase the needed capacitance the PTH 16 is oval with longer sides of the oval parallel to the side walls of the slots 6. Alternatively, a plurality of round PTHs 16 can make the connections in signal lines 14 and provide the needed capacitance. Such a plurality represents several inductors connected in parallel that diminishes the overall inductance of the connection and, at the same time, provides needed value of the capacitance to the side walls to offset the resulting inductance.

Figure 5:
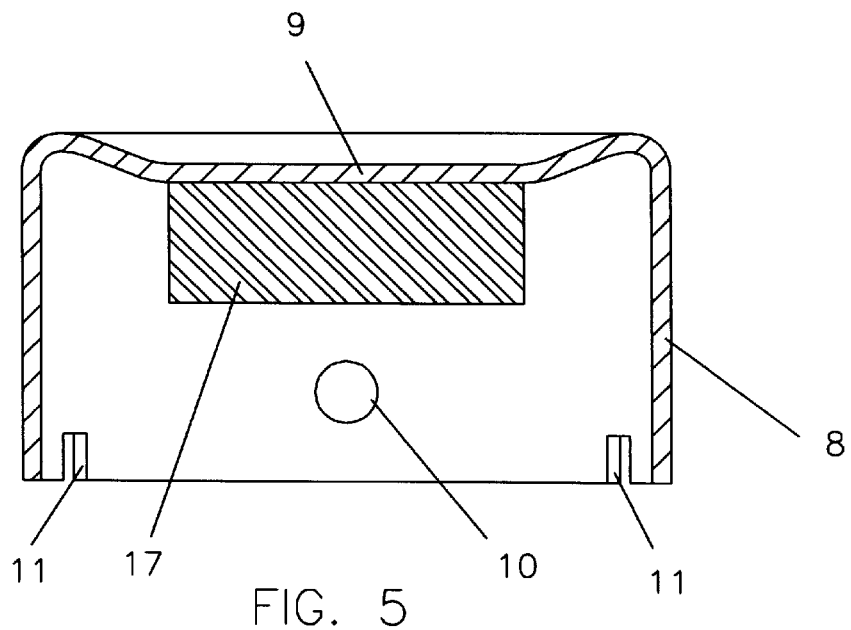
FIG. 5 is a sectional view of the cover shown in assembly with a magnet that is a portion of the ferrite isolator/circulator.

Turning to FIG. 5 a magnet 17 having substantially round shape is disposed on the saucer-like portion 9 inside the cover 2. The magnet 17 is a part of the ferrite isolator/circulator 13 disposed in the structure and shown as an example only.

When structure is totally assembled as shown on FIG. 1, the ferrite isolator/circulator 13 is located coaxial to the central portion of the housing 1. The ends of the PCBs 12 located inside the housing 1 define this coaxial location. Circuit of the ferrite isolator/circulator 13 is connected to signal line on top surface of the PCBs 12. The magnet 17 is centrally located on top of the ferrite-circuit-ferrite structure of the ferrite isolator/circulator 13. The cover 2 is located on top of the housing 1 with dimples 7 protruding into holes 10, the skirt 8 making edge contact to the peripheral portion of the housing 1, and notches 11 snugly receiving the PCBs 12 making contact with ground planes 15. The overall height of the ferrite isolator/circulator 13 is slightly bigger than the gap between bottom surface of the saucer-like portion 9 of the cover 2 and top surface of the central portion of the housing 1. Because of this, in the structure assembly process, the saucer-like portion 9 of the cover 2 is giving way outward to allow the dimples 7 to protrude into the holes 10. Therefore, the ferrite isolator/circulator 13 is pressed in place between the housing 1 and the cover 2 by spring-back action of the saucer-like portion 9 when the structure is finally assembled.

While the invention having been described in detail, it is clear that there are variations and modifications to this disclosure here and above which will be readily apparent to one of ordinary skill in the art. To the extent that such variations and modifications of the present disclosure of a rigid totally closed structure for high power ferrite isolator/circulator having reinforced leads with homogenous signal transmission lines and adequate ground planes on their both top and bottom portions, which result in substantially low IMD product, which are deemed within the scope of the present invention.

I claim:

1. A structure for a passive high power microwave device, comprising:

printed circuit boards having top and bottom surfaces, signal transmission lines, ground planes and connections, wherein said signal transmission lines and said ground planes are disposed on both said top and said bottom surfaces, and within each said board said signal transmission lines on said top surface are electrically connected to said signal transmission lines on said bottom surface by said connections;

a housing having central and peripheral portions, bottom and top surfaces, and selectively located supports, slots and tabs, wherein said supports and tabs are extended from said peripheral portion, the passive device is disposed on said top surface of said central portion and electrically connected to said signal transmission lines on said top surface of said printed circuit boards, said slots are located in said supports and extended into said central portion up to the passive device, and said printed circuit boards are disposed in said slots;

a cover having notches, a skirt and a saucer-like portion, wherein said notches coincide with said slots in said housing to receive said printed circuit boards, said skirt makes contact to said peripheral portion of said housing and to said ground planes on said top surface of said printed circuit boards, and said saucer-like portion is located concentrically with the passive device.

2. A structure as recited in claim 1, wherein said connections in said printed circuit boards are plated through holes located within said central portion of said housing inside said cover.

3. A structure as recited in claim 2, wherein said plated through holes are ovals oriented along said signal transmission lines.

4. A structure as recited in claim 1, wherein said supports in said housing are located substantially symmetrically on both sides of each said printed circuit board extending diagonally from said peripheral portion of said housing to said top surfaces of said printed circuit boards.

5. A structure as recited in claim 1, wherein said bottom surfaces of said printed circuit boards are substantially flush with said bottom surface of said central portion of said housing.

6. A structure as recited in claim 1, wherein said slots in said housing are extended into said central portion in such a way that said printed circuit boards disposed in said slots center the passive device relative to said central portion.

7. A structure as recited in claim 1, wherein said tabs in said housing are bent up to substantially 90 degree angle relative to said top surface of said round portion.

8. A structure as recited in claim 1, wherein said skirt in said cover further comprising holes substantially equally spaced and said tabs in said housing further comprising dimples protruded into said holes.

9. A structure as recited in claim 1, wherein the passive device is pressed in place between said cover and said housing by said saucer-like portion of said cover.

10. A structure for a passive microwave device, comprising:

printed circuit boards having top and bottom surfaces, signal transmission lines, ground planes and connections, wherein said signal transmission lines are disposed on both said top and bottom surfaces and connected to each other by said connections, and said ground planes disposed on the opposite sides of said boards relative to said signal lines;

a housing having central and peripheral portions, top and bottom surfaces, supports, slots and tabs with dimples, wherein said supports and tabs are extended from said peripheral portion, said supports are bent up slightly and said tabs are bent up to substantially 90 degree to said top surface, the passive microwave device is located concentrically with said central portion, and said slots are located in said supports and partially extended into said central portion up to the passive microwave device;

a cover having a skirt and a saucer-like portion, notches and holes, wherein said skirt contacts said top surface of said housing along said peripheral portion, said notches coincide with and are located on top of said slots in said housing forming openings to receive said printed circuit boards, said dimples in said tabs are protruded into said holes in said skirt, and the passive microwave devise is located concentrically to said saucer-like portion and disposed between said saucer-like portion and said central portion of said housing;

said printed circuit boards are disposed in said slots of said housing and in said notches of said cover, wherein said bottom surface of said housing and said bottom surface of said boards are coplanar, the passive microwave device is electrically connected to said signal transmission lines on said top surfaces of said boards, and said ground planes on said top surfaces of said boards make contact with said cover.

* * * * *